United States Patent [19]

Martin

[11] Patent Number: 4,622,670
[45] Date of Patent: Nov. 11, 1986

[54] ERROR-CORRECTION CODING FOR MULTILEVEL TRANSMISSION SYSTEM

[75] Inventor: Gary D. Martin, North Andover, Mass.

[73] Assignee: AT&T Bell Laboratories, Murray Hill, N.J.

[21] Appl. No.: 680,000

[22] Filed: Dec. 10, 1984

[51] Int. Cl.[4] ............................................ G06F 11/10
[52] U.S. Cl. .................................................... 371/43
[58] Field of Search ......................... 371/37, 43, 44, 45

[56] References Cited

U.S. PATENT DOCUMENTS

| | | | |
|---|---|---|---|
| 3,988,677 | 10/1976 | Fletcher et al. | 371/37 X |
| 4,128,828 | 12/1978 | Samejima et al. | 371/43 |
| 4,493,082 | 1/1985 | Cumberton et al. | 371/43 |
| 4,494,239 | 1/1985 | Martin | 375/39 |
| 4,520,490 | 5/1985 | Wei | 371/43 X |
| 4,523,323 | 6/1985 | Nakajima et al. | 371/37 X |
| 4,553,237 | 11/1985 | Nakamura | 371/37 |

OTHER PUBLICATIONS

W. W. Wu, "New Convolutional Codes—Part II", *IEEE Trans. on Communications*, vol. Com-24, No. 1, Jan. 1976, pp. 19–33.

E. L. Cusack, "Error Control Codes for QAM Signalling", *Electronics Letters*, vol. 20, No. 2, Jan. 19, 1984, pp. 62–63.

*Primary Examiner*—Charles E. Atkinson
*Attorney, Agent, or Firm*—Thomas Stafford

[57] ABSTRACT

A technique for improving efficiency of error-correction is disclosed for use in a Gray-coded multilevel transmission system and, specifically, in a quadrature amplitude modulation (QAM) transmission system. To this end, information bits in information bit symbols are converted, i.e., mapped, into error-correction bit symbols having fewer bits than the corresponding information bit symbols. This bit-converting technique permits use of encoders and decoders having a code rate lower than the overall transmission code rate.

36 Claims, 6 Drawing Figures

ERROR-CORRECTION CODING FOR MULTILEVEL TRANSMISSION SYSTEM

TECHNICAL FIELD

This invention relates to transmission systems and, more particularly, to error-correction coding.

BACKGROUND OF THE INVENTION

Heretofore, in digital transmission systems, so-called high rate error-correcting codes were employed in an attempt at correcting errors in transmission. For example, a binary t error-correcting code can correct t binary errors located anywhere within the code block. If $t \geq 3$, the code could correct all three bits in an eight-level information bit symbol. For a Gray-coded system that is operating at a low error rate, this capability is not needed, because almost all errors are adjacent symbol errors. That is, a symbol is received as one that is adjacent to the transmitted symbol, thereby producing a single bit error. As is known, a high rate error-correcting code becomes useless at very high received error rates when nonadjacent information bit symbol errors do occur. Thus, the capability of such a code to correct multibit errors within an information bit symbol may never be used. Indeed, error-correcting encoders and decoders employed in such prior arrangements are complex and inefficient.

SUMMARY OF THE INVENTION

More efficient error-correction coding is obtained in a Gray-coded multilevel modulated signal transmission system by converting, i.e., mapping, bits in input information bit symbols into "error-correction" bit symbols each of which has fewer bits than the corresponding information bit symbol and by correcting only adjacent amplitude level errors.

In a transmitter, the error-correction symbols are supplied to an encoder which generates corresponding error-correction check bits. The error-correction check bits are assembled into symbols which are appropriately multiplexed with the information bit symbols for transmission.

In a receiver, error-correction bit symbols generated from received information bit symbols and corresponding received error-correction check bits are supplied to a decoder which generates decoder output bits. The decoder output bits are used to correct adjacent level errors in the received information bit symbols. Such adjacent level errors are readily determined in a Gray-coded multilevel transmission system.

Consequently, an encoder and a decoder are employed each of which has a lower code rate than the overall code rate of the transmission system. In one example, a 12/13 code rate encoder and decoder are employed in a 18/19 code rate quadrature amplitude modulation transmission system.

BRIEF DESCRIPTION OF THE DRAWING

The invention will be more fully understood from the following detailed description of illustrative embodiments thereof taken in connection with the appended figures, in which:

FIG. 4 depicts in simplified block diagram form a QAM receiver corresponding to the QAM transmitter of FIG. 3 which includes aspects of the invention;

DETAILED DESCRIPTION

Figure 1:
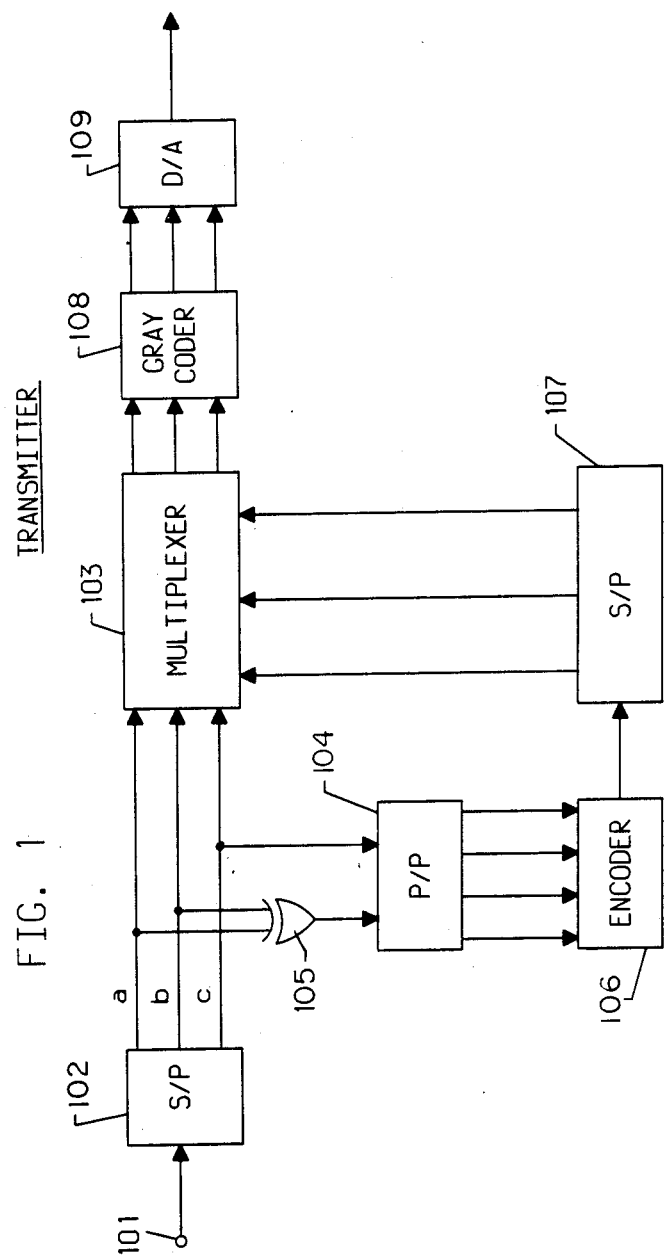
FIG. 1 shows in simplified block diagram form a transmitter for a multilevel transmission system including aspects of the invention.

FIG. 1 shows in simplified block diagram form a transmitter for a multilevel radio transmission system including an aspect of the invention. Accordingly, information bits representative of a level to be transmitted are supplied via terminal 101 to serial-to-parallel (S/P) converter 102. In this example not to be construed as limiting the scope of the invention, the signal to be transmitted is one of eight levels. Consequently, S/P converter 102 converts the serial information bits into three-bit parallel form, i.e., into three-bit information symbols. The three-bit information symbols, namely, bits a, b and c, outputted from S/P converter 102, are supplied to multiplexer 103 and are also converted, in accordance with an aspect of the invention, into error-correction symbols having fewer bits than the information symbols. To this end, the least significant bit, i.e., bit c, of the information bit symbol is supplied as an error-correction bit directly to parallel-to-parallel (P/P) converter 104. The remaining bits, i.e., bits a and b, are combined in accordance with prescribed criteria by Exclusive OR gate 105 and supplied as a second error-correction bit to P/P converter 104. The converting, i.e., mapping, from the three-bit information symbol to the two-bit error-correction symbol along with the associated transmission level are shown in TABLE I.

TABLE I

| Transmission Level | Information Bits | | | Error Correction Bits | |
|---|---|---|---|---|---|
| | a | b | c | a + b | c |
| 7 | 1 | 1 | 0 | 0 | 0 |
| 5 | 1 | 1 | 1 | 0 | 1 |
| 3 | 1 | 0 | 1 | 1 | 1 |
| 1 | 1 | 0 | 0 | 1 | 0 |
| −1 | 0 | 0 | 0 | 0 | 0 |
| −3 | 0 | 0 | 1 | 0 | 1 |
| −5 | 0 | 1 | 1 | 1 | 1 |
| −7 | 0 | 1 | 0 | 1 | 0 | where + indicates an Exclusive OR function.

It should be noted that each two-bit error-correction symbol is associated with two values of information symbols and, hence, two transmission levels. This does not present a problem because the levels associated with the error-correction bits are sufficiently separated from one another and are readily identifiable because any error in the Gray-code transmission of the levels will be an adjacent level error. That is to say, the error-correction technique of the present invention is based on there being only adjacent level errors and that the two levels associated with each of the error-correction bit symbols are more than two levels apart.

P/P converter 104 accumulates two successive error-correction symbols and supplies them to encoder 106. Encoder 106 is, in this example, not to be construed as limiting the scope of the invention, an error-correcting convolutional code type. For clarity of explanation, a 4/5 code rate encoder is being used. In this example, the transmission code rate is 6/7. Consequently, by converting the information bit symbols into error-correction bit symbols having fewer bits than the information bit symbols, in accordance with an aspect of the invention, a significantly lower code rate encoder can be employed to obtain the desired error-correction capability in the higher code rate transmission system. This improves overall error-correcting efficiency because fewer check bits have to be transmitted and, furthermore, signficantly reduces the complexity of the encoder. But for use of the fewer bits into the encoder, in accordance with the invention, a higher code rate encoder would be required, in this example a 6/7 code rate encoder. Encoder 106 generates one check bit for each group of two error-correction bit symbols. Such encoders are known in the art. See, for example, *Error-Correcting Codes*, by W. Wesley Peterson and E. J. Weldon, Jr., 2nd Ed., The MIT Press, 1980, at Chapter 13, for error-correcting convolutional encoder arrangement.

The check bit output from encoder 106 is supplied to serial-to-parallel (S/P) converter 107 which, in turn, accumulates the check bits into three-bit symbols. The check bit symbols are supplied from S/P converter 107 to multiplexer 103 where they are combined with the information bit symbols in well-known fashion. Again, in this example, one check bit symbol is multiplexed every six information bit symbols to yield the 6/7 code rate.

Each output symbol from multiplexer 103 is Gray-coded in Gray-coder 108, and, then, converted to analog form via digital-to-analog (D/A) converter 109 for transmission to a remote receiver.

Figure 2:
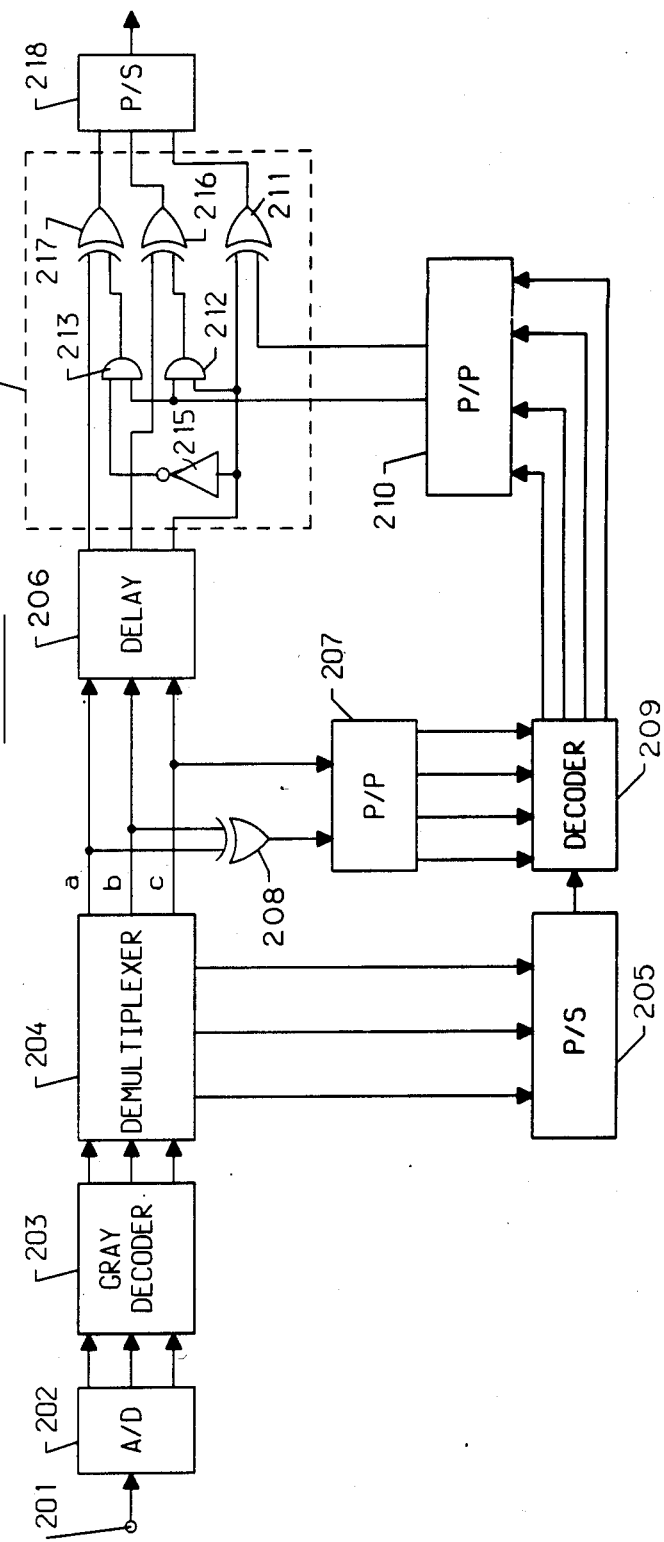
FIG. 2 depicts in simplified block diagram form a receiver corresponding to the transmitter of FIG. 1 which also includes aspects of the invention.

FIG. 2 shows in simplified block diagram form a receiver corresponding to the transmitter of FIG. 1 which includes error correction in accordance with an aspect of the invention. Accordingly, a received Gray-coded modulated signal is supplied via terminal 201 to analog-to-digital (A/D) converter 202 which generates a three-bit symbol representative of the received signal amplitude at a sampling instant. The three-bit output from A/D converter 202 is Gray-decoded via Gray-decoder 203 and supplied to demultiplexer 204. In turn, demultiplexer 204 yields the received information bit symbols and the received check bit symbols. The received information bit symbols including bits a, b and c are supplied to delay 206 while the check bit symbols are supplied to parallel-to-serial (P/S) converter 205. As in the transmitter of FIG. 1, the three bits of the information bit symbols are converted into error-correction symbols each having fewer bits than the corresponding information bit symbol, in accordance with an aspect of the invention. To this end, the least significant bit, c, of the information bit symbol is supplied as a first error-correction bit directly to parallel-to-parallel (P/P) converter 207. The remaining bits, a and b, are combined via Exclusive OR gate 208 and the resulting single bit is supplied as a second error-correction bit to P/P converter 207. The converting, i.e., mapping, of the three bits of the information bit symbols into the two bits of the error-correction symbols is shown in TABLE I above. P/P converter 207 accumulates two error-correction symbols, i.e., four bits, and supplies them in parallel to decoder 209. P/S converter 205 supplies the received check bits to decoder 209 in serial form. Each check bit corresponds to an appropriate group of two error-correction symbols and, hence, two information bit symbols.

Decoder 209 in this example is also a 4/5-code-rate decoder of a type compatible with the encoder used in the transmitter of FIG. 1. Such decoder arrangements are also known in the art and are described in the book entitled *Error-Correcting Codes*, cited above.

Decoder 209 is responsive to the error-correction bits generated from the incoming information bit symbols and supplied via P/P converter 207 and the corresponding check bit supplied via P/S converter 205 to generate the decoder output bits for each of the two successive information bit symbols corresponding to error-correction symbols. The decoder output bits are supplied to parallel-to-parallel (P/P) converter 210 and, in turn, in succession to error-correction unit 214 for correcting errors, if appropriate, in the corresponding information bit symbols. To this end, the decoder output bit corresponding to least significant bit c (TABLE I) is supplied to one input of Exclusive OR gate 211 in error correction unit 214. The decoder output bit corresponding to the remaining bits, a and b, of the information bit symbol is supplied to first inputs of AND gates 212 and 213. The least significant information bit c is supplied from delay 206 to a second input of AND gate 212 and, via inverter 215, to a second input of AND gate 213. The output from AND gate 212 is supplied to a first input of Exclusive OR gate 216, while the output from AND gate 213 is supplied to a first input of Exclusive OR gate 217. The remaining bits, i.e., bits a and b, of an information bit symbol corresponding to the decoder output bits are supplied from delay 206 to appropriate second inputs of Exclusive OR gates 217 and 216; namely, bit a to Exclusive OR gate 217 and bit b to Exclusive OR gate 216. As indicated above, bit c is supplied to Exclusive OR gate 211. Delay 206 is employed to delay the information bit symbols an appropriate interval needed by decoder 209 to generate the decoder output bits.

The outputs from Exclusive OR gates 211, 216 and 217 are supplied to parallel-to-serial (P/S) converter 218 for conversion to serial form and, thereafter, for use as desired.

Operation of the receiver in correcting errors is best illustrated by way of an example. As indicated above, decoder 209 is a 4/5 code rate decoder which receives two input error-correction bits from each of two successive three-bit information symbols via P/P converter 207. If no errors in transmission have occurred, the input error-correction bits to decoder 209 are identical to the error-correction bits supplied to encoder 106 (FIG. 1). Consequently, no correction is made to the bits of the corresponding information bit symbols. However, if adjacent symbol errors occur, then each information bit symbol error will cause a change in one of the error-correction bits in the corresponding two-bit error-correction symbol being supplied to decoder 209. This results from the Gray-code arrangement as shown in TABLE I. For example, assume that a transmitted information bit symbol was 100, and is received as 000. Then, from TABLE I it is seen that the error-correction symbol supplied to encoder 106 was 10, while that supplied to decoder 209 is 00. Again, assuming that only adjacent level errors are occurring, then the 4/5 code rate decoder 209 in response to the check bits and the corresponding error-correction symbol bits will be able, in well-known fashion, to correctly determine which one of the error-correction bits in the symbol was changed by errors in transmission. Consequently, decoder 209 will determine that the error-correction symbol 00, in the above example, should have been 10 and will output bits 10 as the decoder output bits corresponding to the received symbol 000.

It should be noted and as shown in TABLE I that information bit symbols 100 and 010 both would yield a 10 error-correction symbol input to decoder 209. Error-correction unit 214 will choose 100 as the corrected information bit symbol, since in the Gray-code shown in TABLE I, 010 is not adjacent to the received information bit symbol 000 and only adjacent level errors are being corrected.

The decoder output bits 10 are supplied to P/P converter 210 which, in turn, supplies a logical 1 to AND gates 212 and 213 and a logical 0 to Exclusive OR gate 211. Since the received information bit symbol is 000, a logical 0 is supplied from delay 206 to each of Exclusive OR gates 211, 216 and 217, to inverter 215 and to AND gate 212. A logical 1 is supplied from inverter 215 to AND gate 213. Thus, the inputs to Exclusive OR gate 217 are 01 and it yields a logical 1 output; the inputs to Exclusive OR gate 216 are 00 and it yields a logical 0; and the inputs to Exclusive OR gate 211 are 00 and it also yields a logical 0. Therefore, the received 000 information bit symbol is corrected to the desired 100 information bit symbol.

Figure 3:
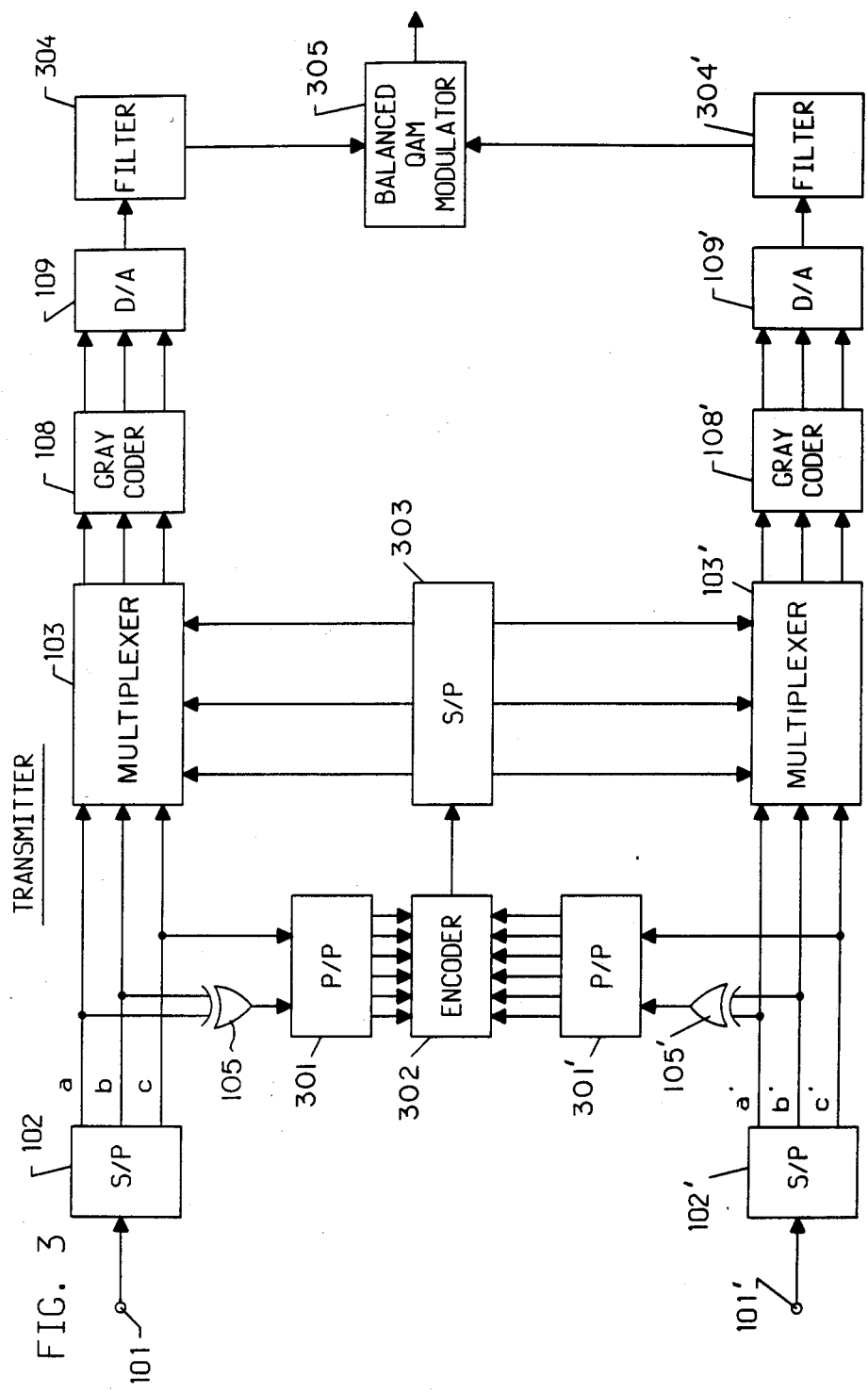
FIG. 3 shows in simplified block diagram form another transmitter for a quadrature amplitude modulation (QAM) transmission system including aspects of the invention.

FIG. 3 shows in simplified block diagram form a transmitter for a quadrature amplitude modulation (QAM) system, in this example, a 64-QAM system which includes two 8-level quadrature information channels. Each of the quadrature information channels employs essentially the same elements as described above in relationship to the transmitter of FIG. 1. Accordingly, the elements which are identical, both physically and functionally, to those in FIG. 1 have been similarly numbered and will not again be discussed in detail. To avoid confusion, however, the elements in the second quadrature information channel will be designated with a (').

Accordingly, the two-bit error-correction symbols corresponding to the information bit symbols from a first quadrature information channel are supplied to parallel-to-parallel (P/P) converter 301. In this example, P/P converter 301 supplies three error-correction symbols, i.e., six error-correction bits corresponding to three successive information bit symbols, in parallel to encoder 302. Similarly, the two-bit error-correction symbols corresponding to the information bit symbols from the second quadrature information channel are supplied to P/P converter 301'. In this example, P/P converter 301' also supplies three error-correction symbols, i.e., six error-correction bits corresponding to three successive information bit symbols, in parallel to encoder 302. The converting, i.e., mapping, of the three-bit information symbols into the two-bit error-correction symbols, in accordance with an aspect of the invention, is as shown in TABLE I above.

In this example, encoder 302 is a 12/13 code rate convolutional encoder. That is to say, one check bit is generated for each 12 error-correction bits. Such encoders are also described in the book entitled *Error-Correcting Codes*, cited above. The check bit generator polynomials for a code rate 12/13 double error-correcting self-orthogonal convolution code are, for example, as follows:

GENERATOR POLYNOMIALS OF A 12/13 CONVOLUTIONAL CODE $G_1(D) = 1 + D^{10} + D^{34} + D^{47}$ $G_2(D) = 1 + D^2 + D^{31} + D^{58}$ $G_3(D) = 1 + D^9 + D^{44} + D^{60}$ $G_4(D) = 1 + D^4 + D^{43} + D^{61}$ $G_5(D) = 1 + D^7 + D^{48} + D^{62}$ $G_6(D) = 1 + D^{25} + D^{33} + D^{63}$ $G_7(D) = 1 + D^5 + D^{45} + D^{64}$ $G_8(D) = 1 + D^{11} + D^{23} + D^{65}$ $G_9(D) = 1 + D^{15} + D^{32} + D^{68}$ $G_{10}(D) = 1 + D + D^{67} + D^{70}$ $G_{11}(D) = 1 + D^{21} + D^{49} + D^{71}$ $G_{12}(D) = 1 + D^{20} + D^{26} + D^{72}$

It is again noted that by employing the unique converting, i.e., mapping, of the information bit symbols into error-correction symbols having fewer bits, in accordance with an aspect of the invention, the much simpler 12/13 code rate encoder is employed as compared to an 18/19 code rate encoder required in prior arrangements.

The check bits from encoder 302 are supplied to serial-to-parallel (S/P) converter 303 which accumulates them and appropriately supplies them in three-bit symbols to multiplexes 103 and 103'. Again, the check symbols are multiplexed with the information bit symbols and the overall transmission code rate, in this example, is 18/19. That is to say, 18 information bits are transmitted for each check bit. The multiplexed outputs from multiplexers 103 and 103' are Gray-coded via Gray-coders 108 and 108', respectively. In turn, the individual Gray-coded signals are converted to analog form via D/A converters 109 and 109' and filtered via filters 304 and 304', respectively. The filtered signals are supplied to QAM balanced modulator 305. Within modulator 305, each analog signal independently modulates the amplitude of one of the quadrature-related carriers. The amplitude modulated carriers are then linearly added to form a QAM signal which may be transmitted as desired.

As in the embodiment of FIG. 1, by giving up the ability to correct nonadjacent symbol errors, a significant reduction is obtained in the code block length (constraint length for a convolutional code). This length reduction, in turn, improves the performance of the code.

In this example, the highest-order term in the set of convolutional code generator polynomials is 72 and the overall code rate is 18/19. Therefore, the effective constraint length is $19(72+1) = 1387$ bits. By contrast, a rate 18/19 double error-correcting self-orthogonal convolutional code listed in an article entitled "New Convolutional Codes—Part II", *IEEE Transactions on Communications*, January 1975, has a constraint length of 5947 bits.

The constraint length, N, of a rate $$\frac{n_o - 1}{n_o}$$

double error-correcting self-orthogonal convolutional code is bounded by $$N \geq 6n_o^2 - 5n_o.$$

Thus, for $n_o = 19$ $N \geq 2071$ bits and a better 18/19 code than shown in the "New Convolutional Code—Part II" article could possibly be found. However, even if such a code could possibly be constructed, its constraint length would still be significantly larger than that obtained by using a lower rate encoder in conjunction with the mapping invention. As will be apparent to those skilled in the art, a shorter constraint length reduces the storage required in the receiver decoder and it improves the code performance.

Figure 4:
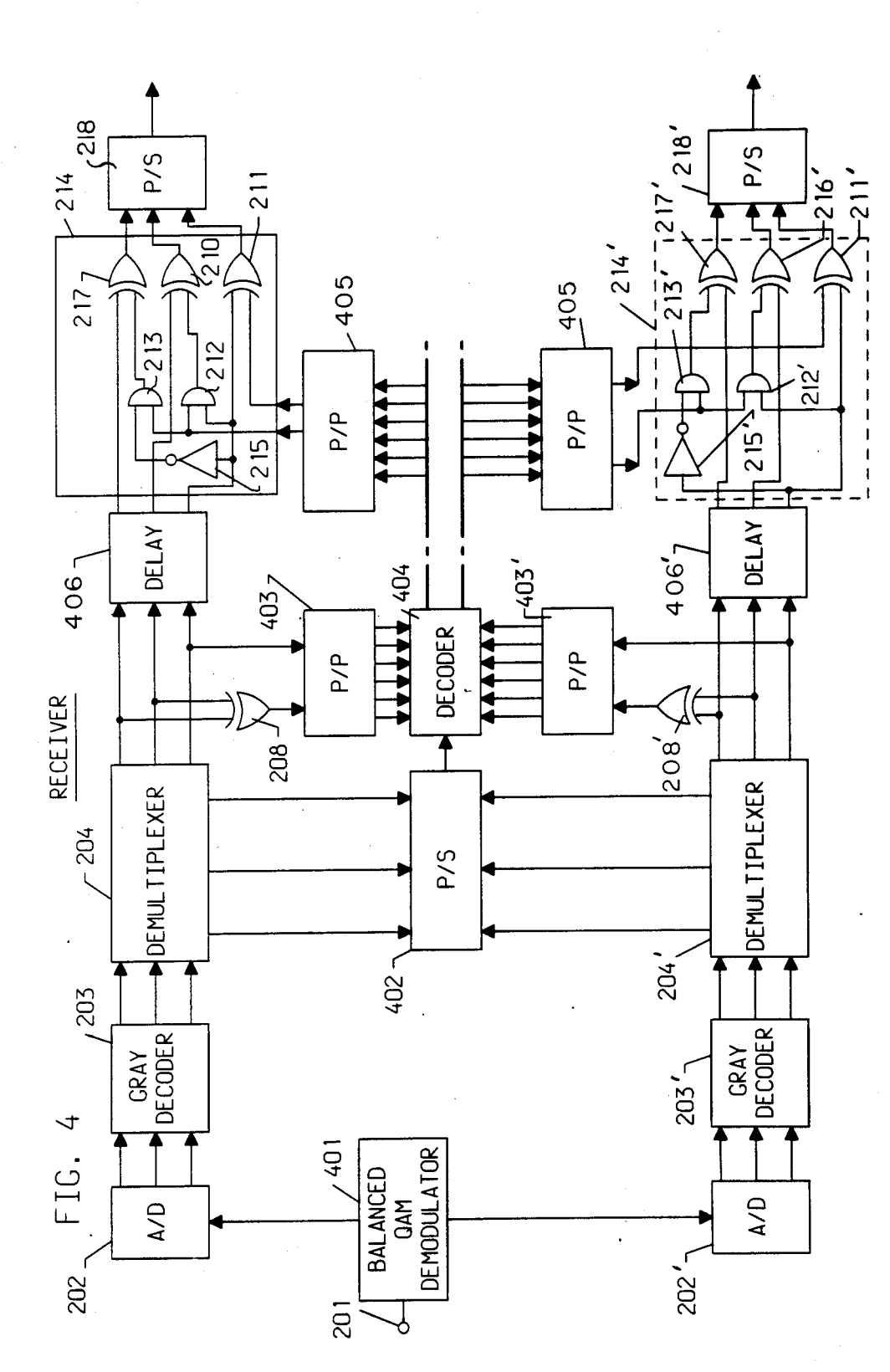

FIG. 4 shows in simplified block diagram form a QAM receiver corresponding to the QAM transmitter of FIG. 3 which includes error correction in accordance with an aspect of the invention. In this example, the receiver 64-QAM includes two 8-level quadrature information channels. Each of the quadrature information channels employs essentially the same elements as described above in relationship to the receiver of FIG. 2. Therefore, the elements which are identical, both physically and functionally, to those in FIG. 2 have been similarly numbered and will not again be discussed in detail. To avoid confusion, however, the elements in one of the quadrature information channels will be designated with an (').

Accordingly, a received Gray-coded QAM signal is supplied via terminal 201 to balanced QAM demodulator 401. Within QAM demodulator 401, the received QAM signal is demodulated into two analog signals. One of the analog signals is supplied to a first one of the quadrature information channels and the other analog signal is supplied to the second one of the quadrature information channels.

The demultiplexed check bit symbols from demultiplexers 204 and 204', i.e., from the first and second quadrature information channels, respectively, are supplied to parallel-to-serial (P/S) converter 401.

In turn, P/S converter 402 supplies the check bits in serial form to decoder 404.

The two-bit error-correction symbols corresponding to information bit symbols from the first quadrature information channel are supplied to parallel-to-parallel (P/P) converter 403. In this example, P/P converter 403 supplies three error-correction symbols corresponding to three successive information bit symbols, i.e., six error-correction bits, in parallel to decoder 404. Similarly, the two-bit error-correction symbols corresponding to the information bit symbols from the second quadrature information channel are supplied to P/P converter 403'. In this example, P/P converter 403' also supplies three error-correction symbols corresponding to three successive information bit symbols, i.e., six error-correction bits, in parallel to decoder 404. The converting, i.e., mapping, of the three-bit information symbols into the two-bit error-correction symbols, in accordance with an aspect of the invention, is as shown in TABLE I above.

Decoder 404 is responsive to the error-correction bits from P/P converters 403 and 403' and the check bits from P/S converter 402 to generate six decoder output bits corresponding to the three successive received information bit symbols on the first quadrature information channel which decoder output bits are supplied to P/P converter 405, and to generate six decoder output bits corresponding to the three successive information bit symbols on the second quadrature information channel which decoder output bits are supplied to P/P converter 405'. The decoder output bits are supplied from P/P converters 405 and 405' in groups of two corresponding to an information bit symbol being supplied from delays 406 and 406', respectively, to error-correction units 214 and 214', respectively. Error-correction units 214 and 214' operate as described above in correcting the information bit symbol. Delay units 406 and 406' insert a delay of sufficient duration for decoder 404 to generate the decoder output bits for the three successive information bit symbols. In this example, decoder 404 is a code rate 12/13 double error-correcting decoder of a type compatible with encoder 302 of FIG. 3 and also broadly described in the book entitled *Error-Correcting Codes*, cited above. The convolutional code generator polynomials shown above are also used in decoder 404.

Figure 5:
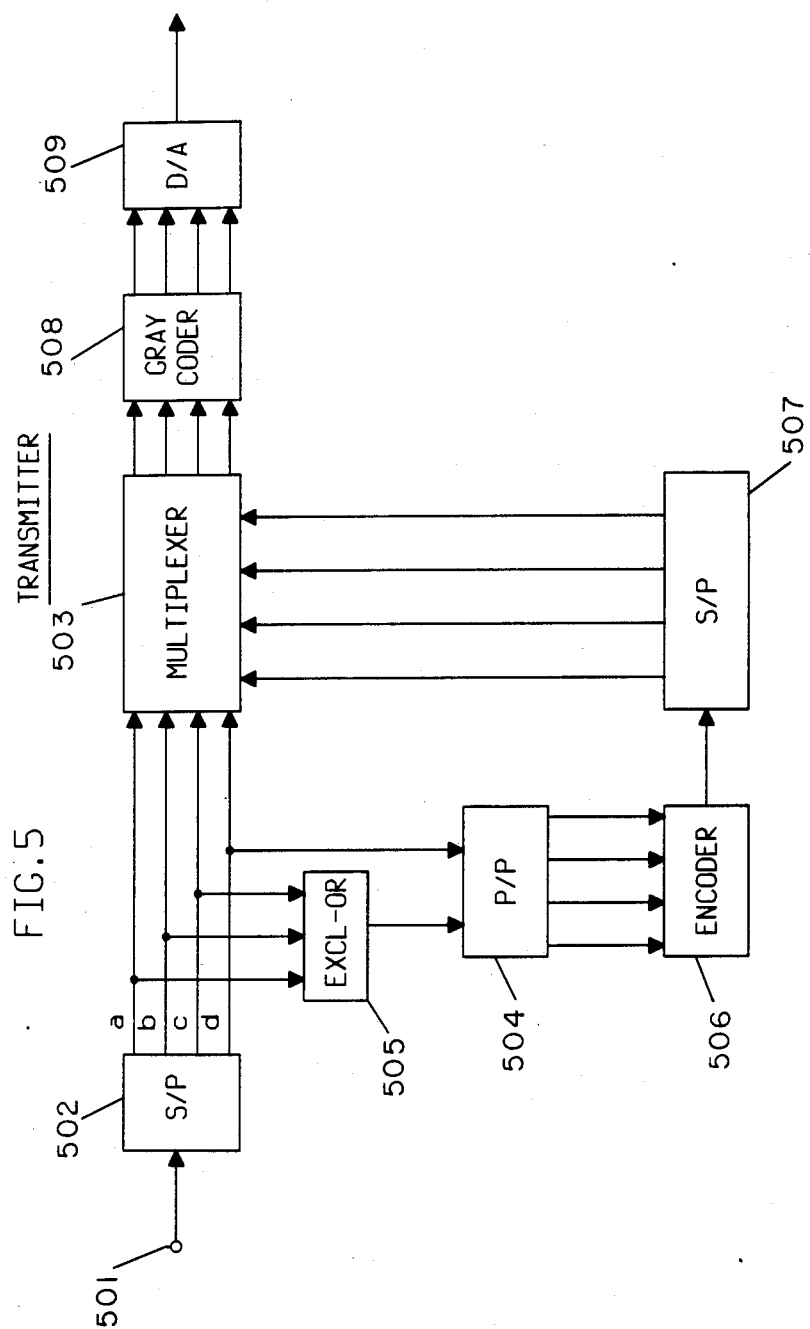
FIG. 5 shows in simplified block diagram form another transmitter for another multilevel transmission system including aspects of the invention.

FIG. 5 shows in simplified block diagram form a transmitter for a Gray-coded multilevel transmission system including an aspect of the invention. Accordingly, information bits representative of a level to be transmitted are supplied via terminal 501 to serial-to-parallel (S/P) converter 502. In this example not to be construed as limiting the scope of the invention, the signal to be transmitted is one of 16 levels. Consequently, S/P converter 502 converts the serial information bits into four-bit parallel form, i.e., into four-bit information symbols. The four-bit information symbols, namely, bits a, b, c and d, outputted from S/P converter 502, are supplied to multiplexer 503 and are also converted, in accordance with an aspect of the invention, into error-correction symbols having fewer bits than the information symbols. To this end, the least significant bit, i.e., bit d, of the information bit symbol is supplied as an error-correction bit directly to parallel-to-parallel (P/P) converter 504. The remaining bits, i.e., bits a, b and c, are combined in accordance with prescribed criteria by Exclusive OR gate 505 and supplied as a second error-correction bit to P/P converter 504. The converting, i.e., mapping, from a four-bit information symbol to a two-bit error-correction symbol along with the associated transmission level is shown in TABLE II.

TABLE II

| Transmission Level | Information Bits | | | | Error-Correction Bits Exclusive OR | |
|---|---|---|---|---|---|---|
| | a | b | c | d | a b c | d |
| 15 | 1 | 1 | 0 | 0 | 0 | 0 |
| 13 | 1 | 1 | 0 | 1 | 0 | 1 |
| 11 | 1 | 1 | 1 | 1 | 1 | 1 |
| 9 | 1 | 1 | 1 | 0 | 1 | 0 |
| 7 | 1 | 0 | 1 | 0 | 0 | 0 |
| 5 | 1 | 0 | 1 | 1 | 0 | 1 |
| 3 | 1 | 0 | 0 | 1 | 1 | 1 |
| 1 | 1 | 0 | 0 | 0 | 1 | 0 |
| −1 | 0 | 0 | 0 | 0 | 0 | 0 |
| −3 | 0 | 0 | 0 | 1 | 0 | 1 |
| −5 | 0 | 0 | 1 | 1 | 1 | 1 |
| −7 | 0 | 0 | 1 | 0 | 1 | 0 |
| −9 | 0 | 1 | 1 | 0 | 0 | 0 |
| −11 | 0 | 1 | 1 | 1 | 0 | 1 |

TABLE II-continued

| Transmission Level | Information Bits | | | | Error-Correction Bits Exclusive OR | |
|---|---|---|---|---|---|---|
| | a | b | c | d | a b c | d |
| −13 | 0 | 1 | 0 | 1 | 1 | 1 |
| −15 | 0 | 1 | 0 | 0 | 1 | 0 |

It should be noted that each two-bit error correction symbol is associated with four values of information symbols and, hence, four transmission levels. This does not present a problem because the levels associated with the error-correction bits are sufficiently separated from one another and are readily identifiable because any error in the Gray-code transmission of the levels will be an adjacent level error. That is to say, the error-correction technique of the present invention is based on there being only adjacent level errors and that the four levels associated with each of the error-correction bit symbols are more than two levels apart.

P/P converter 504 accumulates two successive error-correction symbols and supplies them to encoder 506. Encoder 506 is, in this example, not to be construed as limiting the scope of the invention, an error correcting convolutional code type. For clarity of explanation, a code rate of 4/5 encoder is being used. In this example, the transmission code rate is 8/9. Consequently, by converting, i.e., mapping, the information bit symbols into error-correction bit symbols having fewer bits than the information bit symbols, in accordance with an aspect of the invention, a significantly lower code rate encoder can be employed to obtain the desired error-correction capability in the higher code rate transmission system. This improves overall error-correcting efficiency and significantly reduces the complexity of the encoder. But for use of the fewer bits into the encoder, in accordance with the invention, a higher code rate encoder would be required, in this example a 8/9 code rate encoder. Encoder 506 generates one check bit for each group of two error-correction bit symbols. Such encoders are known in the art. See, for example, the book entitled *Error-Correcting Codes,* cited above at Chapter 13, for error-correcting convolutional encoder arrangement.

The check bit output from encoder 506 is supplied to serial-to-parallel (S/P) converter 507 which, in turn, accumulates the check bits into four-bit symbols. The check bit symbols are supplied from S/P converter 507 to multiplexer 503 where they are combined with the information bit symbols in well-known fashion. Again, in this example, one check bit symbol is multiplexed every eight information bit symbols to yield the 8/9 code rate.

Each output symbol from multiplexer 503 is Gray-coded in Gray-coder 508 and, then, converted to analog form via digital-to-analog (D/A) converter 509 for transmission to a remote receiver.

Figure 6:
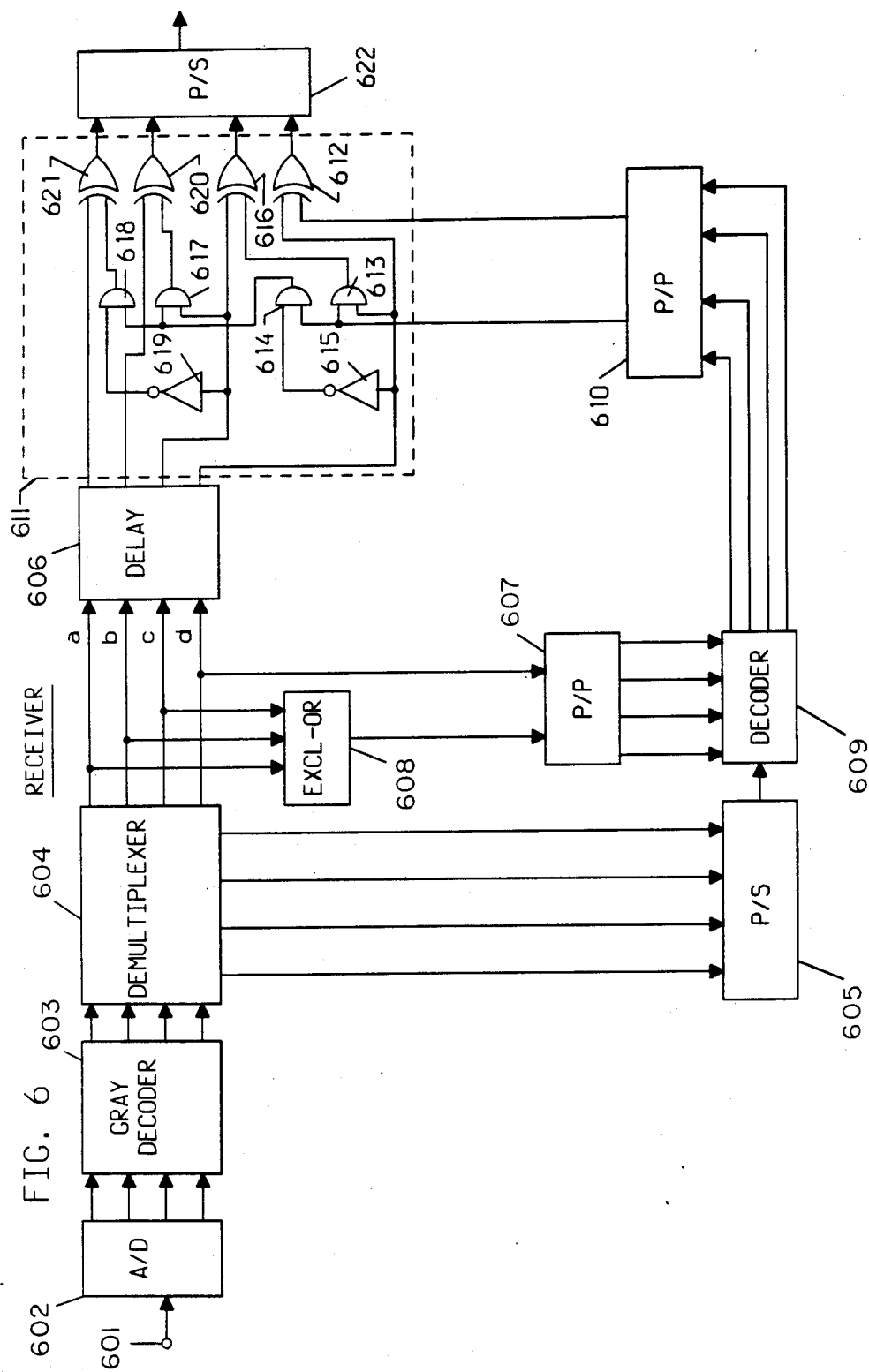
FIG. 6 shows in simplified block diagram form a receiver corresponding to the transmitter of FIG. 5 which also includes aspects of the invention.

FIG. 6 shows in simplified block diagram form a receiver corresponding to the transmitter of FIG. 5 which includes error correction in accordance with an aspect of the invention. Accordingly, a receiver Gray-coded modulated signal is supplied via terminal 601 to analog-to-digital (A/D) converter 602 which generates a four-bit symbol representative of the received signal amplitude at a sampling instant. The four-bit output from A/D converter 602 is Gray-decoded via Gray-decoder 603 and supplied to demultiplexer 604. In turn, demultiplexer 604 yields the received information bit symbols and the received check bit symbols. The received information bit symbols including bits a, b, c and d are supplied to delay 606 while the check bit symbols are supplied to parallel-to-serial (P/S) converter 605. As in the transmitter of FIG. 5, the four bits of the information bit symbols are converted into error-correction symbols each having fewer bits than the corresponding information bit symbol, in accordance with an aspect of the invention. To this end, the least significant bit, d, of the information bit symbol is supplied as a first error-correction bit directly to parallel-to-parallel (P/P) converter 607. The remaining bits, a, b and c, are combined via Exclusive OR gate 608 and the resulting single bit is supplied as a second error-correction bit to P/P converter 607. The converting, i.e., mapping, of the four bits of the information bit symbols into the two bits of the error-correction symbols is shown in TABLE II above. P/P converter 607 accumulates two error-correction symbols, i.e., four bits, and supplies them in parallel to decoder 609. P/S converter 605 supplies the received check bits to decoder 609 in serial form.

Decoder 609 in this example is also a 4/5-code-rate decoder of a type compatible with the encoder used in the transmitter of FIG. 5. Such decoder arrangements are also known in the art and are described in the book entitled *Error-Correcting Codes,* cited above.

Decoder 609 is responsive to the error-correction bits generated from the incoming information bit symbols and supplied via P/P converter 607 and the corresponding check bit supplied via P/S converter 605 to generate the decoder output bits for each of the two successive information bit symbols corresponding to the supplied error-correction symbols. The decoder output bits are supplied to parallel-to-parallel (P/P) converter 610 and, in turn, in succession to be employed in error-correction unit 611 to correct errors, if appropriate, in the information bit symbols. To this end, the decoder output bit corresponding to least significant bit d (TABLE II) is supplied to one input of Exclusive OR gate 612 in error-correction unit 611. The decoder output bit corresponding to the remaining bits, a, b and c, of the information bit symbol is supplied to first inputs of AND gates 613 and 614. The least significant information bit d is supplied to a second input of Exclusive OR gate 612, to a second input of AND gate 613 and, via inverter 615, to a second input of AND gate 614. The output from AND gate 613 is supplied to a first input of Exclusive OR gate 616 while the output from AND gate 614 is supplied to an input of each of And gates 617 and 618. Information bit c, which is the next significant bit, is supplied to a second input of Exclusive OR gate 616, to an input of AND gate 617 and, via inverter 619, to an input of AND gate 618. The remaining bits of an information bit symbol corresponding to the decoder output bits, namely, bits a and b, are supplied from delay 606 to appropriate second inputs of Exclusive OR gates 621 and 620, respectively. Delay 606 is employed to delay the information bit symbols an appropriate interval needed by decoder 609 to generate the decoder output bits.

The outputs from Exclusive OR gates 612, 616, 620 and 621 are supplied to parallel-to-serial (P/S) converter 622 for conversion to serial form and, thereafter, for use as desired.

Operation of the receiver in correcting errors is best illustrated by way of an example. As indicated above, decoder 609 is a 4/5 code rate decoder which receives two input error-correction bits from each of two successive four-bit information symbols via P/P converter 607. If no errors in transmission have occurred, the input error-correction bits to decoder 609 are identical to the error-correction bits supplied to encoder 506 (FIG. 5). Consequently, no correction is made to the bits of the corresponding information bit symbols. However, if adjacent symbol errors occur, then each information bit symbol error will cause a change in one of the error-correction bits in the corresponding two-bit error-correction symbol being supplied to decoder 609. This results from the Gray-code arrangement as shown in TABLE II. For example, assume that a transmitted information bit symbol was 1010, and is received as 1110. Then, from TABLE II it is seen that the error-correction symbol supplied to encoder 506 was 10, while that supplied to decoder 609 is 00. Again, assuming that only adjacent level errors are occurring, then the 4/5 code rate decoder 609 in response to the appropriate check bits and the corresponding error-correction symbol bits is able, in well-known fashion, to correctly determine which one of the error-correction bits in the symbol was changed by errors in transmission. Consequently, decoder 609 will determine that the error-correction symbol 10, in the above example, should have been 00 and will output 10 as the decoder output bits corresponding to the received symbol 1110.

It should be noted and as shown in TABLE II that information bit symbols 1100, 1010, 0000 and 0110 all would yield a 00-error-correction symbol input to decoder 609. Error-correction unit 611 would choose 1010 as the information bit symbol, since in the Gray-code shown in TABLE II, 1100, 0000 and 0110 are not adjacent to the received information bit symbol 1110 and only adjacent level errors are being corrected.

The decoder output bits 10 are supplied to P/P converter 610 which, in turn, supplies a logical 1 to AND gates 613 and 614 and a logical 0 to Exclusive OR gate 612. Since the received information bit symbol is 1110, a logical 1 is supplied from delay 606 to each of Exclusive OR gates 616, 620 and 621, to inverter 619, and to AND gate 617. Delay 606 also supplies a logical 0 to inverter 615, AND gate 613 and Exclusive OR gate 612. A logical 1 is supplied from inverter 615 to AND gate 614 and a logical 0 is supplied from inverter 619 to AND gate 618. AND gate 614 supplies a logical 1 to inputs of AND gates 617 and 618. Thus, the inputs to Exclusive OR gate 621 are 10 and it yields a logical 1 output; the inputs to Exclusive OR gate 620 are 11 it yields a logical 0; the inputs to Exclusive OR gate 616 are 10 and it yields a logical 1; and the inputs to Exclusive OR gate 612 are 00 and it yields a logical 0. Therefore, the received 1110 information bit symbol is corrected to the desired 1010 information bit symbol.

In this example, the four-bit information symbols are converted into two-bit error-correction symbols. If desired, the four-bit information symbols may be converted into three-bit error-correction symbols. In that event, the least and next to least significant bits would be converted directly as error-correction bits and the remaining bits would be Exclusively OR'ed to yield the third error-correction bit in the symbol.

The foregoing disclosure is merely illustrative of the principles of the present invention and numerous modifications or alterations may be devised by those skilled in the art without departing from the spirit and scope of the invention. For example, although the invention is disclosed in a pulse amplitude modulation transmission system, it is understood that it is equally applicable to other types of transmission systems, namely, frequency shift keying, phase shift keying, pulse width modulation, or the like. Additionally, so-called block codes may be employed in place of the disclosed convolutional codes. Moreover, if higher code rate encoders and corresponding decoders were used in conjunction with the unique converting technique, the overall code rate would be increased which, in turn, would reduce the bandwidth needed to transmit the same information. Furthermore, it will be apparent that the 16-level transmitter and receiver may equally be employed in a quadrature amplitude modulation transmission system similar to that shown in FIGS. 3 and 4.

What is claimed is:

1. A multilevel modulated signal transmitter of the type including an encoder for generating error-correction check bits and means for multiplexing said error-correction check bits with information bits for transmission, wherein the improvement comprises, means for converting information bits of information bit symbols to be transmitted into corresponding error-correction bit symbols each having fewer bits than a corresponding one of said information bit symbols, and means for supplying said error-correction bit symbols to said encoder.

2. The invention as defined in claim 1 wherein each of said information bit symbols includes a predetermined number of bits representative of a Gray-coded amplitude level.

3. The invention as defined in claim 2 wherein the transmitter is adapted to transmit information at a first predetermined transmission code rate and said encoder has a second predetermined code rate lower than and in predetermined relationship to said first code rate.

4. The invention as defined in claim 3 wherein said converting means includes means for supplying at least a least significant one of said information bits from an information bit symbol as one bit of a corresponding error-correction bit symbol and means for combining the other bits of said information bit symbol in accordance with a predetermined criterion and supplying the result of said combining as a second error-correction bit of said error-correction bit symbol.

5. The invention as defined in claim 4 wherein said combining means comprises an Exclusive OR gate.

6. The invention as defined in claim 4 wherein said means for supplying said error-correction bit symbols to said encoder includes means for accumulating a predetermined number of said error-correction bit symbols and for supplying the bits of said accumulated error-correction bit symbols in parallel to said encoder.

7. The invention as defined in claim 4 wherein said encoder is an error-correcting encoder of a type employing a convolutional code for generating said error-correction check bits in response to said bits of said error-correction bit symbols.

8. The invention as defined in claim 4 wherein each of said information bit symbols includes three information bits and wherein each of said error-correction bit symbols includes two error-correction bits.

9. The invention as defined in claim 4 wherein each of said information bit symbols includes at least four information bits and wherein each of said error-correction bit symbols includes at least two error-correction bits.

10. In a multilevel modulated signal receiver of the type including a decoder responsive to received check bits and error-correction bit symbols for generating decoder output bits to correct errors, means for supplying received check bits to said decoder and means responsive to said decoder output bits for correcting errors in bits of received information bit symbols, wherein the improvement comprises, means for converting bits of said received information bit symbols into corresponding error-correction bit symbols each having fewer bits than a corresponding one of said received information bit symbols, and means for supplying said error-correction bit symbols to said decoder.

11. The invention as defined in claim 10 wherein each of said information bit symbols includes a predetermined number of bits representative of a Gray-coded amplitude level.

12. The invention as defined in claim 11 wherein the receiver is adapted to receive information at a first predetermined transmission code rate and said decoder has a second predetermined code rate lower than and in predetermined relationship to said first code rate.

13. The invention as defined in claim 12 wherein said converting means includes means for supplying at least a least significant one of said information bits from an information bit symbol as one bit of a corresponding error-correction bit symbol and means for combining the other bits of said information bit symbol in accordance with a predetermined criterion and supplying the result of said combining as a second error-correction bit of said error-correction bit symbol.

14. The invention as defined in claim 13 wherein said combining means comprises an Exclusive OR gate.

15. The invention as defined in claim 13 wherein said means for supplying said error-correction bit symbols to said decoder includes means for accumulating a predetermined number of said error-correction bit symbols and for supplying the bits of said accumulated error-correction bit symbols in parallel to said decoder.

16. The invention as defined in claim 13 wherein said decoder is an error-correcting decoder of a type employing a convolutional code for generating said decoder output bits in response to said bits of said error-correction bit symbols.

17. The invention as defined in claim 13 wherein each of said information bit symbols includes three information bits and wherein each of said error-correction bit symbols includes two error-correction bits.

18. The invention as defined in claim 13 wherein each of said information bit symbols includes at least four information bits and wherein each of said error-correction bit symbols includes at least two error-correction bits.

19. A multilevel transmitter for use in a quadrature amplitude modulation transmission system of the type including first and second information channels, an error-correcting encoder for generating error-correction check bits, means in each of said information channels for multiplexing said error-correction check bits with information bits for transmission and means for modulating first and second quadrature related carrier signals with the multiplexed outputs from said first and second information channels, respectively, wherein the improvement comprises, means in relationship with said first information channel for converting information bits of information bit symbols to be transmitted into corresponding first error-correction bit symbols each having fewer bits than a corresponding one of said information bit symbols, means for supplying said first error-correction bit symbols to said encoder, means in relationship with said second information channel for converting information bits of information bit symbols to be transmitted into corresponding second error-correction bit symbols each having fewer bits than a corresponding one of said information bit symbols, and means for supplying said second error-correction bit symbols to said encoder.

20. The invention as defined in claim 19 wherein each of said information bit symbols in each of said information channels includes a predetermined number of bits representative of a Gray-coded amplitude level.

21. The invention as defined in claim 20 wherein the transmitter is adapted to transmit information at a first predetermined transmission code rate and said encoder has a second predetermined code rate lower than and in predetermined relationship to said first code rate.

22. The invention as defined in claim 21 wherein said first code rate is 18/19 and said second code rate is 12/13.

23. The invention as defined in claim 21 wherein each of said converting means includes means for supplying at least a least significant one of said information bits from an information bit symbol as one bit of a corresponding error-correction bit symbol and means for combining the other bits of said information bit symbol in accordance with a predetermined criterion and supplying the result of said combining as a second error-correction bit of said error-correction bit symbol.

24. The invention as defined in claim 23 wherein said combining means comprises an Exclusive OR gate.

25. The invention as defined in claim 23 wherein said means for supplying said first error-correction bit symbols to said encoder and said means for supplying said second error-correction bit symbols to said encoder each includes means for accumulating a predetermined number of said error-correction bit symbols and for supplying the bits of said accumulated error-correction bit symbols in parallel to said encoder.

26. The invention as defined in claim 23 wherein said encoder is an error-correcting encoder of a type employing double error-correcting convolutional code generator polynomials for generating said error-correction check bits in response to said bits of said first and second error-correction bit symbols.

27. The invention as defined in claim 23 wherein each of said information bit symbols includes at least three information bits and wherein each of said error-correction bit symbols includes at least two error-correction bits.

28. A multilevel modulated signal receiver for use in a quadrature amplitude modulated transmission (QAM) system of the type including means for demodulating an incoming QAM signal into first and second information signal channels, means in each of said information signal channels for demultiplexing the signal therein into information bit symbols and check bit symbols, a decoder responsive to received check bits and error-correction bit symbols for each of said information channels for generating first decoder output bits to correct errors in information bit symbols in said first information channel and second decoder output bits to correct errors in information bit symbols in said second information channel, means for supplying said check bits from said first and second information channels to said decoder, means in said first information channel and being responsive to said first decoder output bits for correcting errors in bits of said first information bit symbols and means in said second information channel and being responsive to said second decoder output bits for correcting errors in bits of said second information bit symbols, wherein the improvement comprises, means in relationship with said first information channel for converting information bits of received information bit symbols into corresponding first error-correction bit symbols each having fewer bits than a corresponding one of said information bit symbols, means for supplying said first error-correction bit symbols to said decoder, means in relationship with said second information channel for converting information bits of received information bit symbols into corresponding second error-correction bit symbols each having fewer bits than a corresponding one of said information bit symbols, and means for supplying said second error-correction bit symbols to said decoder.

29. The invention as defined in claim 28 wherein each of said information bit symbols in each of said information channels includes a predetermined number of bits representative of a Gray-coded amplitude level.

30. The invention as defined in claim 29 wherein the receiver is adapted to receive information at a first predetermined transmission code rate and said decoder has a second predetermined code rate lower than and in predetermined relationship to said first code rate.

31. The invention as defined in claim 30 wherein said first code rate is 18/19 and said second code rate is 12/13.

32. The invention as defined in claim 30 wherein each of said converting means includes means for supplying at least a least significant one of said information bits from an information bit symbol as one bit of a corresponding error-correction bit symbol and means for combining the other bits of said information bit symbol in accordance with a predetermined criterion and supplying the result of said combining as a second error-correction bit of said error-correction bit symbol.

33. The invention as defined in claim 32 wherein said combining means comprises an Exclusive OR gate.

34. The invention as defined in claim 32 wherein said means for supplying said first error-correction bit symbols to said decoder and said means for supplying said second error-correction bit symbols to said decoder each includes means for accumulating a predetermined number of said error-correction bit symbols and for supplying the bits of said accumulated error-correction bit symbols in parallel to said decoder.

35. The invention as defined in claim 32 wherein said decoder is an error-correcting decoder of a type employing a double error-correcting convolutional code for generating said error-correction check bits in response to said bits of said first and second error-correction bit symbols.

36. The invention as defined in claim 32 wherein each of said information bit symbols includes at least three information bits and wherein each of said error-correction bit symbols includes at least two bits.

* * * * *